United States Patent [19]
Chiu et al.

[11] Patent Number: 5,471,172
[45] Date of Patent: Nov. 28, 1995

[54] "AB CASCODE" AMPLIFIER IN AN INPUT STAGE OF AN AMPLIFIER OR COMPARATOR

[75] Inventors: Kwok-Fu Chiu; Don R. Sauer, both of San Jose, Calif.

[73] Assignee: National Semiconductor Corporation, Santa Clara, Calif.

[21] Appl. No.: 296,057

[22] Filed: Aug. 24, 1994

[51] Int. Cl.$^6$ .................................................. H03F 3/45
[52] U.S. Cl. ........................... 330/253; 330/51; 330/261; 330/295; 330/298; 330/311
[58] Field of Search .................................. 327/65, 66, 67, 327/545; 330/51, 207 P, 252, 253, 261, 295, 298, 311

[56] References Cited

U.S. PATENT DOCUMENTS

| | | | |
|---|---|---|---|
| 4,271,394 | 6/1981 | Leidich | 330/253 X |
| 5,153,529 | 10/1992 | Koda et al. | 330/261 X |
| 5,337,007 | 8/1994 | Barrett, Jr. et al. | 330/261 X |

OTHER PUBLICATIONS

Ahuja et al, "A Programmable CMOS Dual Channel Interface Processor for Telecommunications Applications", *IEEE Journal of Solid–State Circuits*, vol. SC–19, No. 6, Dec. 1984, pp. 892–899.

Excerpt from the book entitled "CMOS Analog Circuit Design" by Phillip E. Allen, Douglas R. Holberg, Saunders College Publishing, pp. 421–426 Copyright 1987.

Article entitled "Design Techniques for Cascoded CMOS Op Amps with Improved PSRR and Common–Mode Input Range" by David B. Ribner and Miles A. Copeland, IEEE Journal, vol. SC–19, No. 6, Dec. 1984.

Article entitled "MOS Operational Amplifier Design—A Tutorial Overview" by Paul R. Gray and Robert G. Meyer, IEEE Journal, vol. SC–17, No. 6, Dec. 1982, pp. 969–982.

Article entitled "High–Frequency CMOS Switched–Capacitor Filters for Communications Application" by Tat C. Choi, etc. IEEE Journal, vol. SC–18, No. 6, Dec. 1983, pp. 652–664.

*Primary Examiner*—James B. Mullins
*Attorney, Agent, or Firm*—Skjerven, Morrill, MacPherson, Franklin & Friel; Edward C. Kwok

[57] ABSTRACT

An AB Cascode amplifier provides low quiescent current operation, while maintaining the high gain and wide bandwidth of prior art folded cascode amplifier. Instead of fixed current sources, the AB cascode amplifier uses variable current sources, which are biased by a fixed small current source and two variable biased transistor.

3 Claims, 9 Drawing Sheets

"AB CASCODE" AMPLIFIER IN AN INPUT STAGE OF AN AMPLIFIER OR COMPARATOR

BACKGROUND OF THE INVENTION

1. Field of the Invention

The present invention relates to the design of an input stage to an amplifier or comparator; in particular, the present invention relates to the design of a cascode amplifier in an input stage of an amplifier or a comparator.

2. Discussion of the Related Art

The folded cascode amplifier, also called a common-source common-gate amplifier, is known to provide high frequency, high gain and high bandwidth performance. The design and operational characteristics of folded cascode amplifier are discussed extensively in (i) *CMOS Analog Circuit Design,* by P. Allen and D. Holberg, pp. 421–426, published by Harcourt Brace Jovanovich College Publishers (1987), (ii) "MOS Operational Amplifier Design—A Tutorial Overview" by P. Gray and R. Myer, IEEE Journal of Solid State Circuits, Vol. SC-17, No-6, December 1983, pp. 969–982, (iii) "Design Techniques for Cascoded CMOS Op Amps with Improved PSRR and Common-mode Input Range", by D. Ribner and M. Copeland, IEEE Journal of Solid State Circuits, Vol. SC-19, No. 6, December 1984, pp. 919–925; and (iv) "High Frequency CMOS Switched Capacitor Filters for Communication Applications" by T. Choi et al, IEEE Journal of Solid State Circuits, Vol. SC-18, No. 6, December 1983, pp. 652–64.

Figure 6:
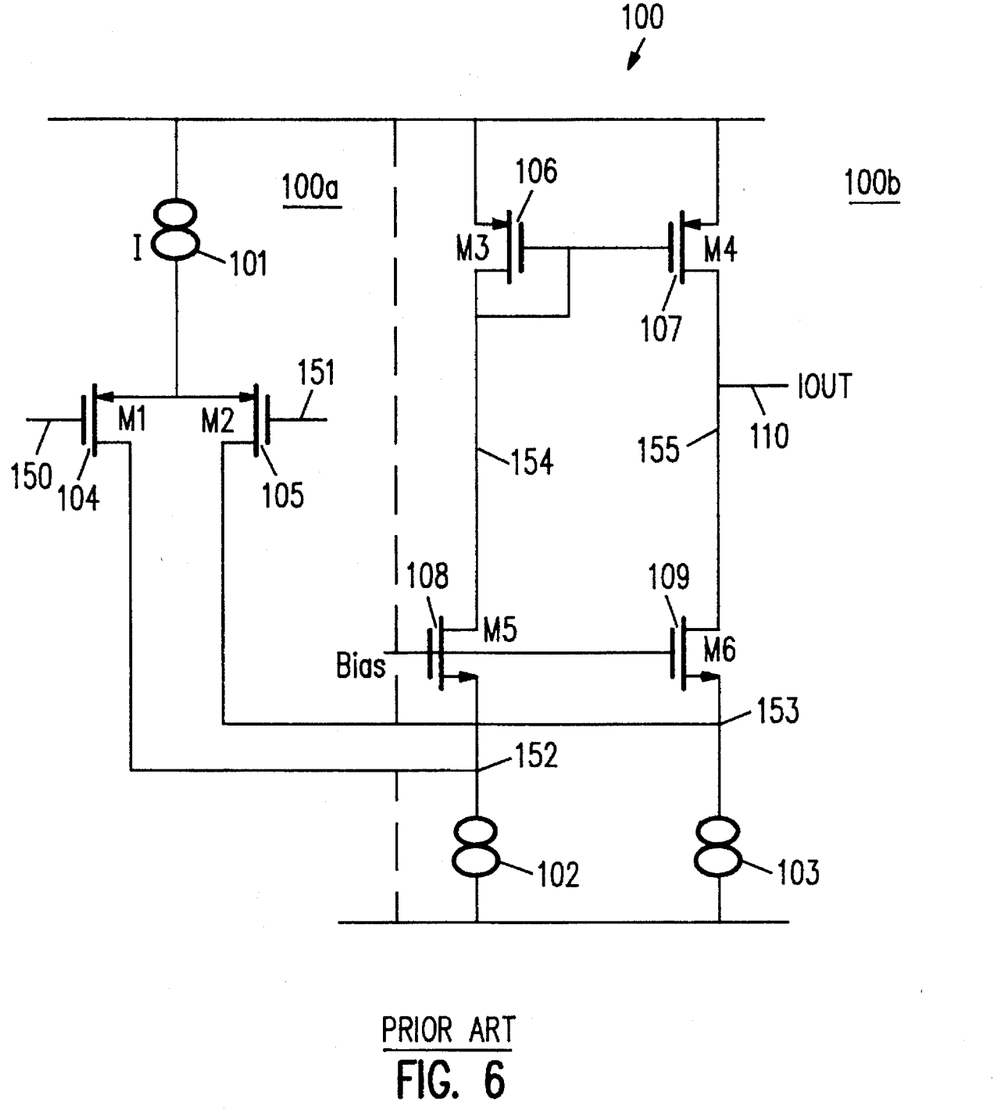
FIG. 6 is a schematic diagram of a conventional folded cascode amplifier 100.

FIG. 6 shows a conventional folded cascode input stage amplifier 100. As shown in FIG. 6, the gate terminals 151 and 150 of PMOS transistors 104 and 105 provide the input terminals for receiving a differential input voltage intola first stage 100a of folded cascode amplifier 100. A current source 101 provides a current I, which is split between transistors 104 and 105. The differential input voltage at the gate terminals of transistors 104 and 105 is converted in a second stage 100b into a unipolar output voltage at terminal 110. Second stage 100b includes PMOS transistors 106 and 107, NMOS transistors 108 and 109, and current sources 102 and 103 connected in a cascode configuration. NMOS transistors 108 and 109 receive a common bias voltage $V_{BIAS}$ to perform a level shifting function for transistors 106 and 107.

During operation, when a differential input voltage appears across input terminals 150 and 151, the current in transistor 104 decreases. As a result, the current in both transistors 106 and 108 increases. The current in transistor 106 is mirrored to transistor 107, so that the current in transistor 107 also increases. At the same time, the current in transistor 105 increases, resulting in a decrease in current in transistor 109. The net result of the increase in current in transistor 107 and the decrease in current in transistor 109 is a net increase in output current at the output node 110. With a high impedance load at output node 110, the voltage at node 110 rises towards the supply voltage $V_{cc}$ until equilibrium occurs. Conversely, if a negative differential voltage is impressed across terminals 150 and 151, the current in transistor 109 increases and the current in transistor 107 decreases, so that the voltage at terminal 110 falls towards ground voltage. Thus, the voltage at terminal 110 follows the differential voltage across terminals 150 and 151.

At equilibrium, transistors 104 and 105 each carry a current I/2. However, the differential voltage across terminals 150 and 151 can be large enough so that virtually all of the current in current source 101 flows through transistor 104. If the current at current source 102 is less than I, then transistors 106 and 108 conduct no current. Further, the current in transistor 105 is limited to I, so that transistor 105 is forced to operate in the "triode" region, which has very low transconductance. As a result, the transconductance and gain of circuit 100 are severely impaired. In other words, the effective current provided at node 110 is less than I. To prevent this result, an additional "overdrive" current $I_{od}$ is provided. Thus, the current sources 102 and 103 each sink a current equal to I+$I_{od}$, to yield a total quiescent current in folded cascode amplifier 100 of 2*I+2*$I_{od}$.

One major disadvantage of a folded cascode amplifier is the large quiescent currents, leading to high power dissipation, which is not desirable in many applications requiring low power operation.

SUMMARY OF THE INVENTION

In accordance with the present invention, a comparator circuit includes (i) an input protection circuit receives a differential input signal, and provides a differential output signal corresponding to the differential input signal; (b) an input stage circuit receiving the differential output signal, including an AB cascode amplifier, for providing the comparator's output signal; and (iii) a bias circuit for providing a bias voltage used in the input protection circuit and the input stage circuit.

The AB Cascode amplifier comprising (i) a first, second and third current sources coupled to a first supply voltage source; (ii) fourth and fifth current sources coupled to a second supply voltage source; (iii) a first transistor coupled at its source terminal to the first current source, at its gate terminal a first input signal, and at its drain terminal to the fourth current source; (iv) a second transistor coupled at its source terminal to the first current source, at its gate terminal a second input signal, and at its drain terminal to fifth current source; (v) a first level converter coupled between the second and the fourth current sources; (vi) a second level converter coupled between the third and the fifth current sources; (vii) a third transistor coupled at its source terminal to the first supply voltage source and having its gate and drain terminals coupled together; (viii) a fourth transistor coupled at its source terminal to the first supply voltage source and at its gate terminal coupled to the gate terminal of the third transistor; (ix) a fifth transistor coupled at its source terminal to the fifth current source, at its gate terminal to the first level converter, and at its drain terminal coupled to the drain terminal of the third transistor; and (x) a sixth transistor coupled at its source terminal to the fourth current source, at its gate terminal to the second level converter, and a drain terminal coupled to the drain terminal of the fourth transistor.

The present invention is better understood upon consideration of the detailed description below and the accompanying drawings.

DETAILED DESCRIPTION OF THE PREFERRED EMBODIMENTS

Figure 1:
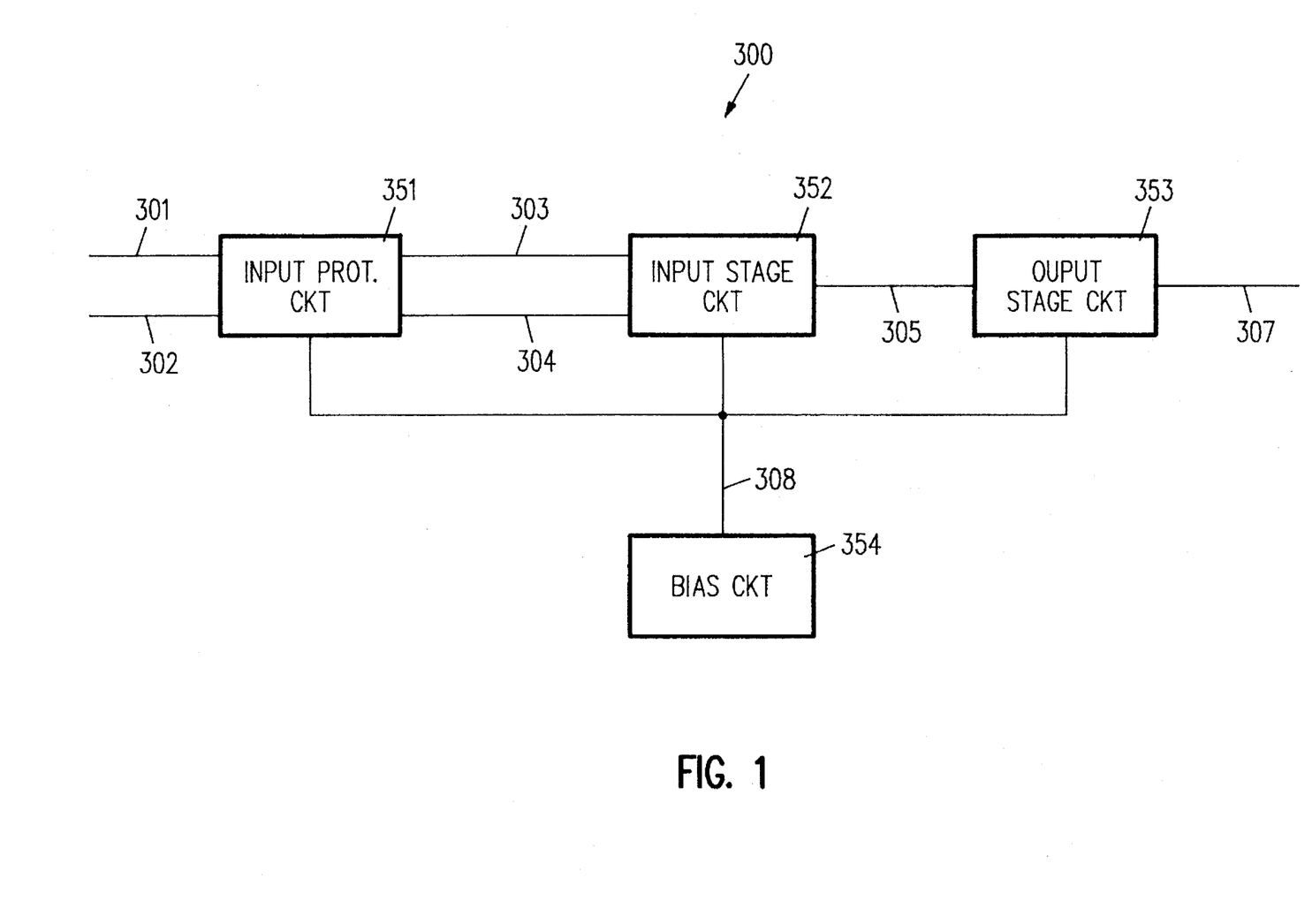
FIG. 1 shows a comparator 300, in accordance with one embodiment of the present invention.
Figure 3A:
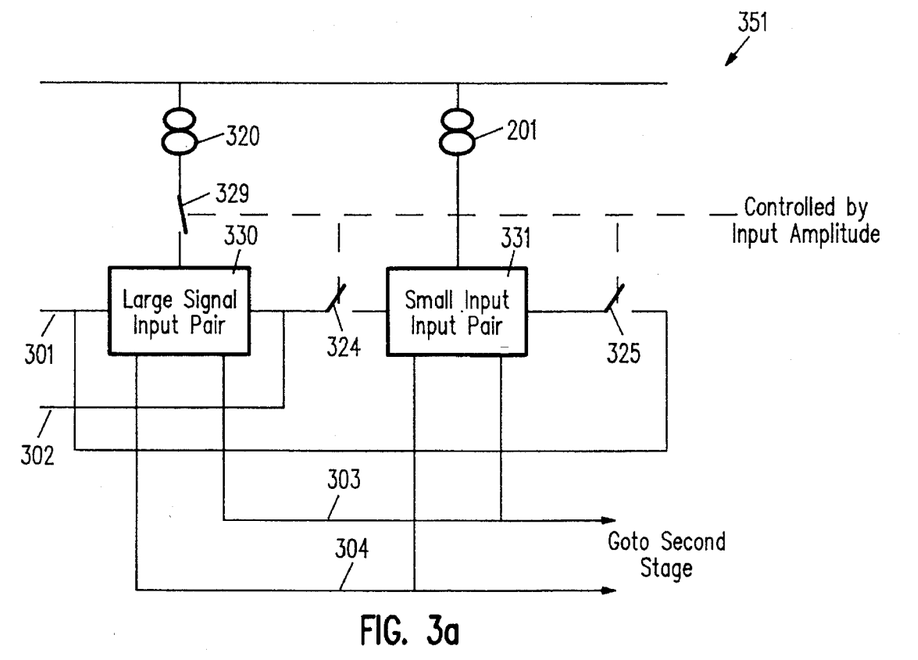
FIG. 3a is a block diagram of input protection circuit 351 of the present embodiment.
Figure 3B:
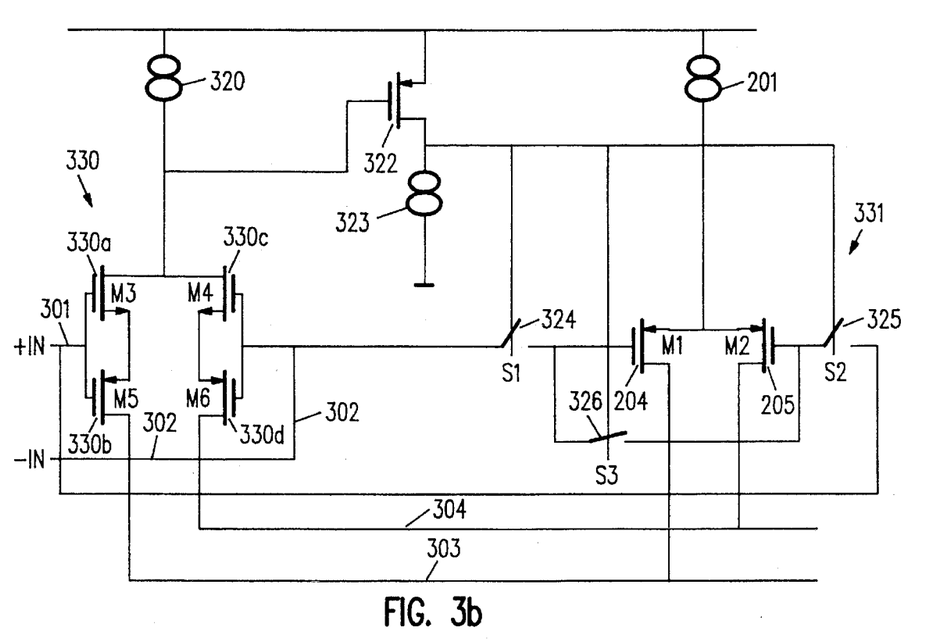
FIG. 3b is a schematic circuit of input protection circuit 351 of the present embodiment.
Figure 3C:
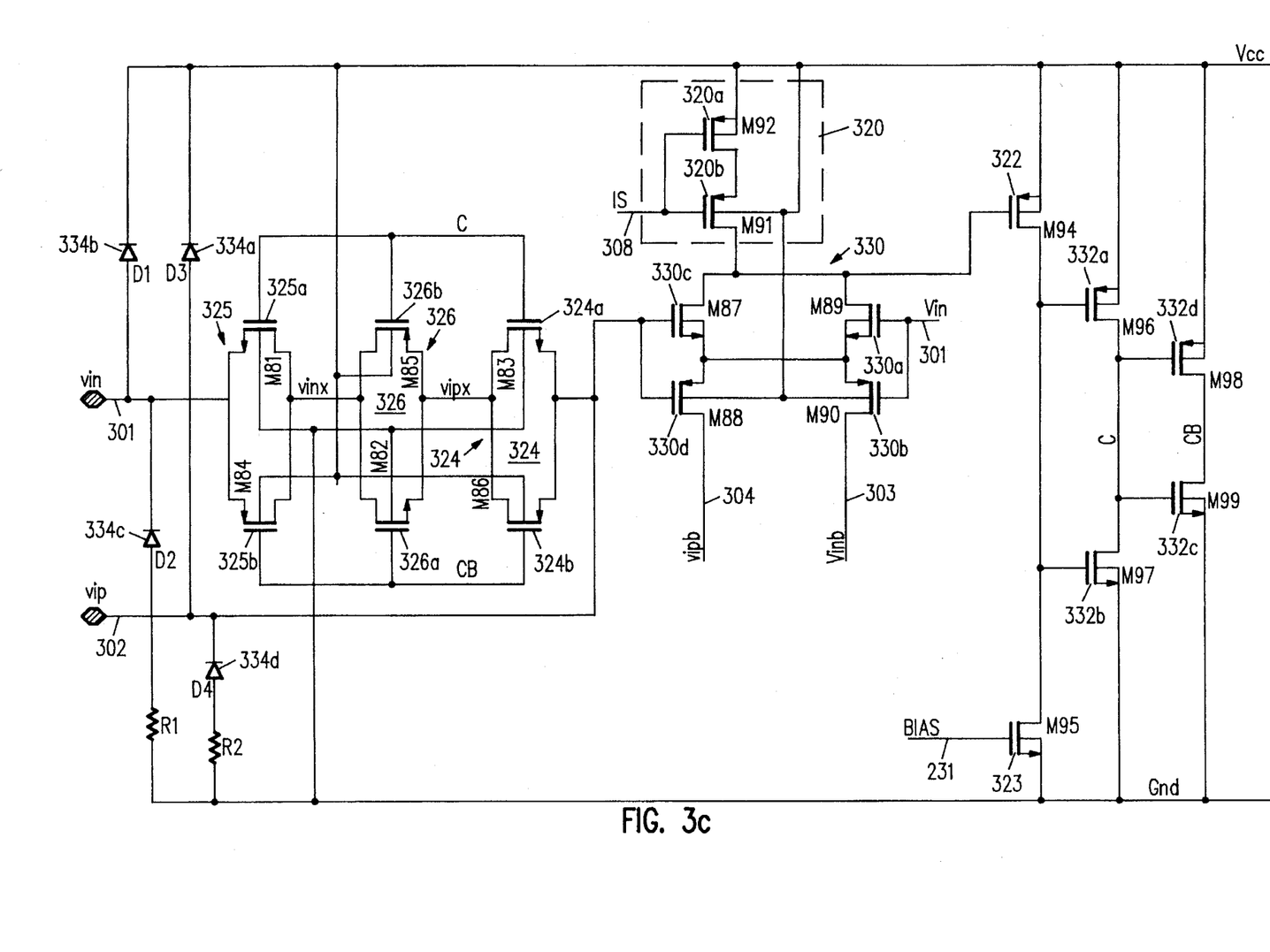
FIG. 3c is a transistor level schematic circuit showing in further detail input protection circuit 351 of the present embodiment.

One embodiment of the present invention is provided in a comparator circuit 300 shown in FIG. 1. FIG. 1 is a block diagram of comparator circuit 300, which can be implemented as a CMOS integrated circuit. As shown in FIG. 1, comparator 300 includes input protection circuit 351, input stage circuit ("AB cascode amplifier") 352, output stage circuit 353 and bias circuit 354. A differential signal is received into input protection circuit 351 across terminals 301 and 302. Input protection circuit is designed to minimize comparator 300's "$V_{os}$" (offset voltage) performance. FIGS. 3a, 3b and 3c are respectively a block diagram and a schematic circuit, and a transistor level schematic circuit for input protection circuit 351, which is described in further detail in copending patent application entitled "Input Protection Circuit for a CMOS Comparator," by Kwok-Fu Chiu et al, Ser. No. 08/296,056, filed on the same day as the present application, assigned to National Semiconductor Corp., also the assignee of the present invention, bearing Attorney's Docket no. NS-2376. The detailed description of input protection circuit 351 and the accompanying drawings in the copending patent application, Attorney's docket number NS-2376, are hereby incorporated by reference. Input protection circuit 351 provides a differential output signal across terminals 303 and 304 substantially proportional to the differential input signal across terminals 301 and 302.

Input stage circuit 352 is described in further detail below. In response to the differential signal across terminals 303 and 304, input stage circuit 352 provides an output signal 305 which is indicative of whether the voltage at terminal 301 is higher than the voltage at terminal 302. The voltage $V_{os}$ represents the minimum voltage by which the voltage at terminal 301 must exceed the voltage at terminal 302 to drive the output signal at terminal 305 to "logic high".

Figure 4A:
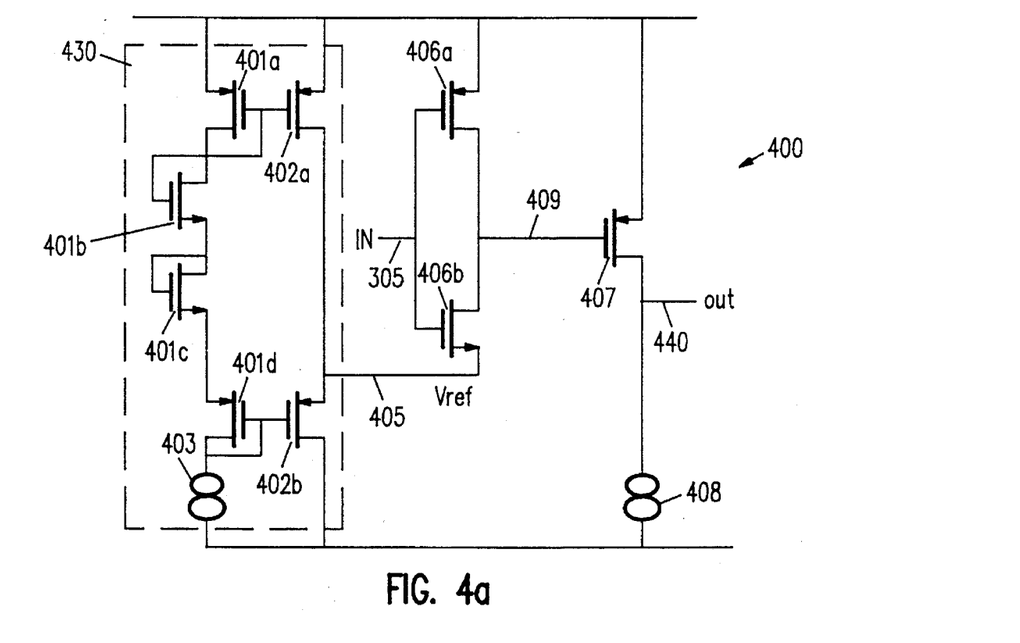
FIG. 4a is a schematic circuit of output stage circuit 353 of the present embodiment.
Figure 4B:
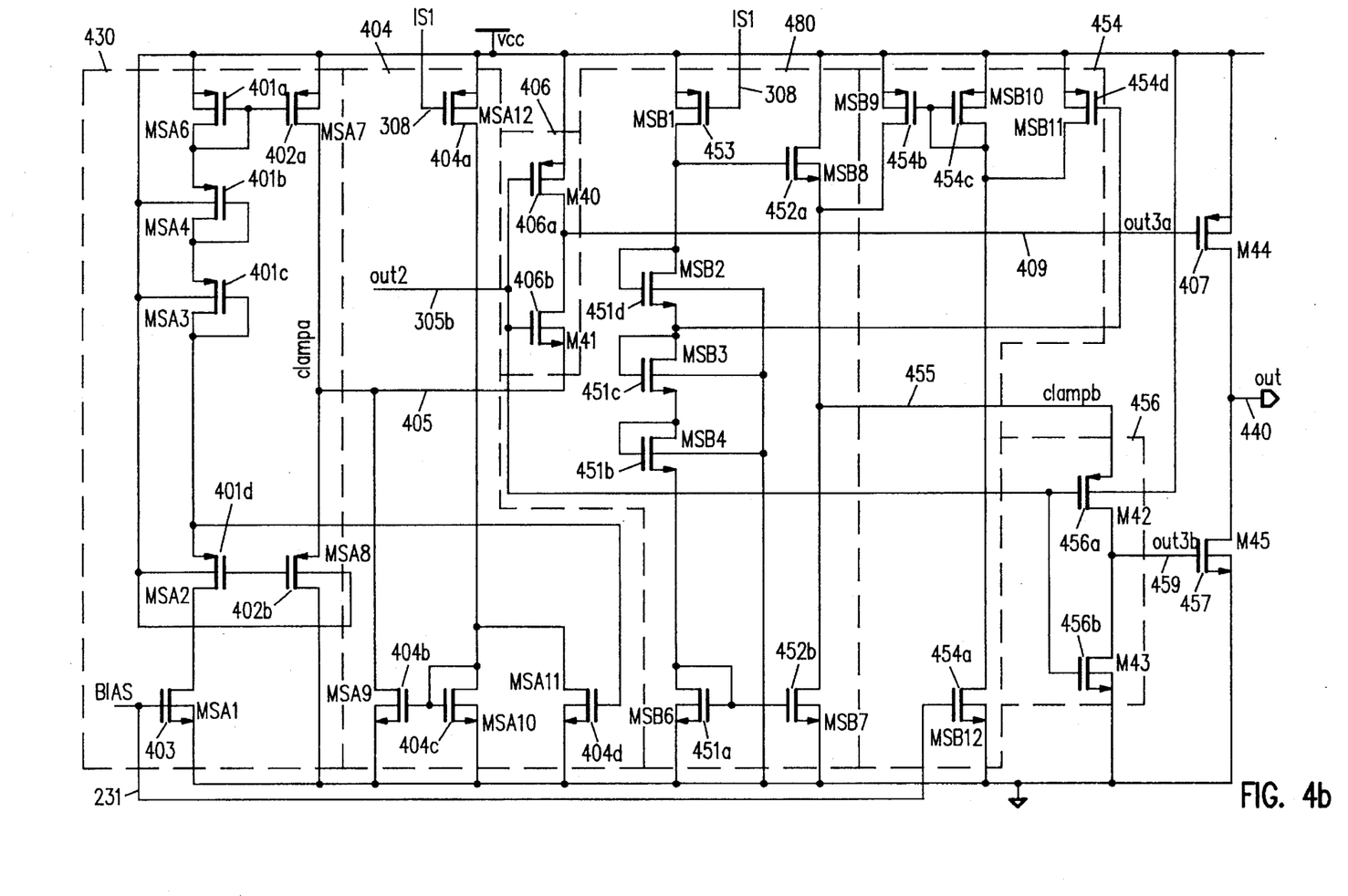
FIG. 4b is a transistor level schematic circuit showing in further detail output stage circuit 353 of the present invention.

The output signal at terminal 305 is amplified by output stage circuit 353 as the output signal of comparator 300. This output signal of comparator 300 is provided at terminal 307. Output stage circuit 353 includes a structure adapted for short circuit protection. FIG. 4a and 4b are schematic circuits of output stage 353. Output stage 353 is described in further detail in copending patent application entitled "Output Circuit with Short Circuit Protection in a CMOS Comparator," by Kwok-Fu Chiu et al, Ser. No. 295,138, filed on the same day as the present application, assigned to National Semiconductor Corp., also the assignee of the present invention, now U.S. application Ser. No. 08/295,135 filed on Aug. 24, 1994. The detailed description of output stage 353 and the related drawings in copending patent application, Ser. No. 08/295,135 filed on Aug. 28, 1994, are hereby incorporated by reference.

Figure 5A:
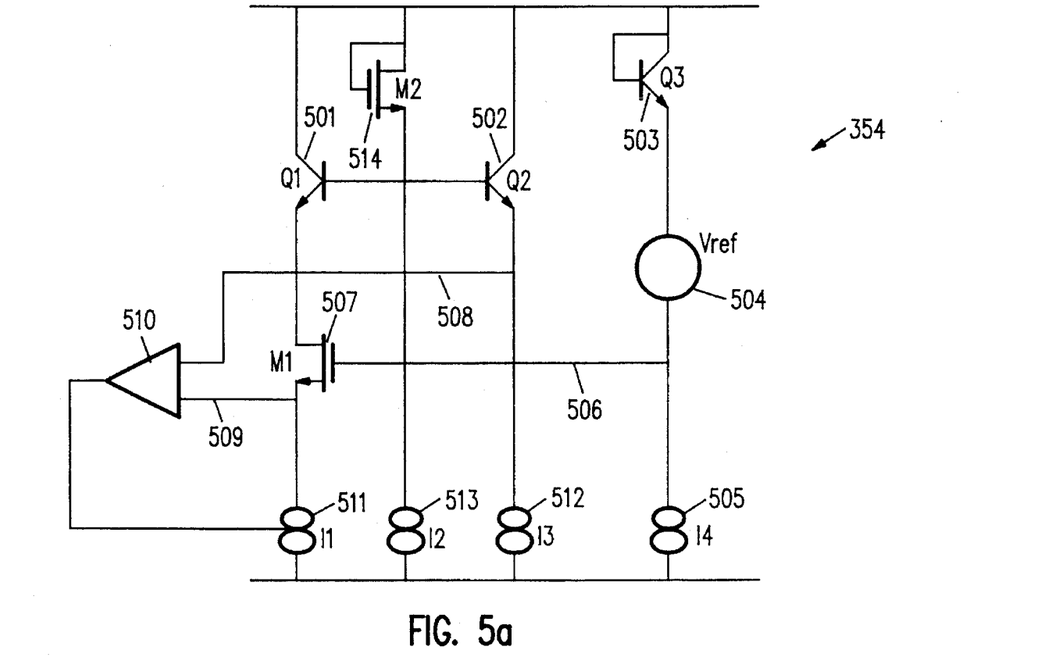
FIG. 5a is a schematic circuit of bias circuit 354 of the present embodiment.
Figure 5B:
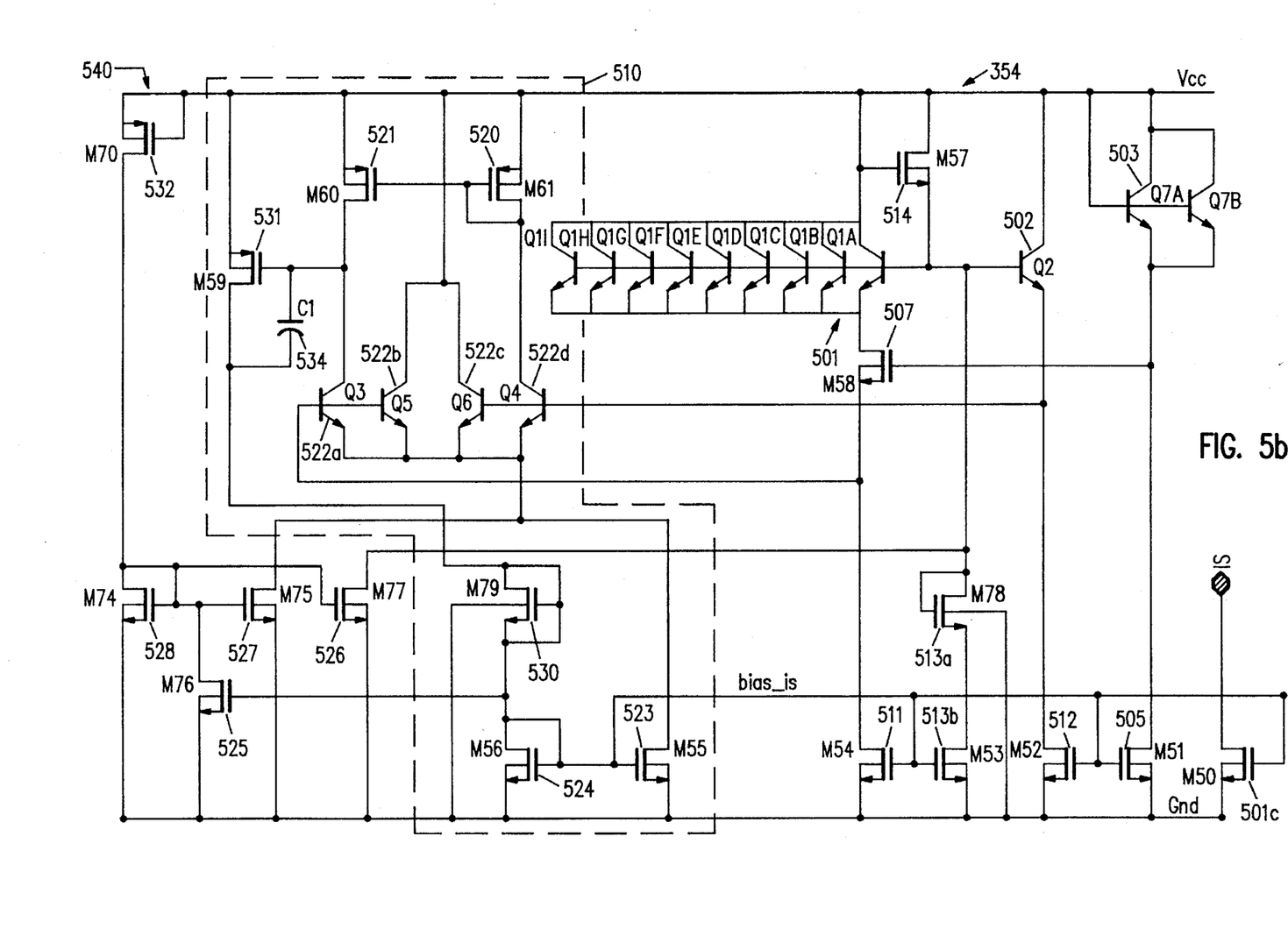
FIG. 5b is a transistor level schematic circuit showing in further detail bias circuit 354 of the present embodiment.

Input protection circuit 351, input stage circuit 352 and output stage circuit 353 all receive a bias voltage at terminal 308 from bias circuit 354. This bias voltage is designed to be process variation insensitive so as to ensure each implementation of comparator 300 provide the same reliable operation regardless of the variations in the manufacturing process. FIGS. 5a and 5b are schematic diagrams of bias circuit 354 of the present invention. Bias circuit 354 is described in copending patent application entitled "Circuit for Generating a Process Variation Insensitive Reference Bias Current," by Kwok-Fu Chiu, Ser. No. 295,331, filed on the same day as the present application, assigned to National Semiconductor Corp., also the assignee of the present invention, U.S. patent application Ser. No. 08/295,331. The detailed description of bias circuit 354 and the related drawings in copending patent application, Ser. No. 08/295,331, are hereby incorporated by reference.

Figure 2A:
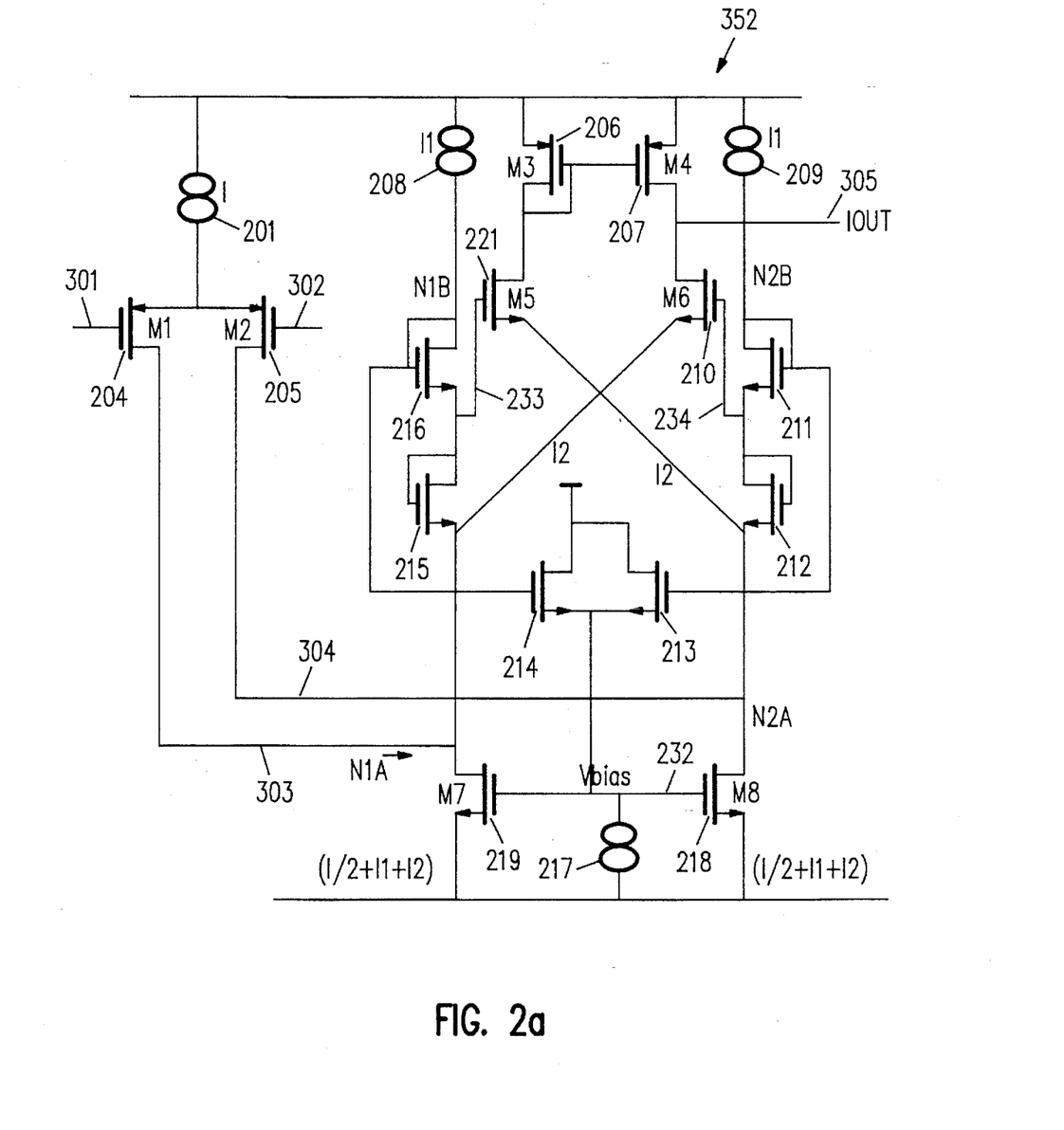
FIG. 2a is a schematic diagram of an AB cascode amplifier 352, in accordance with the present invention.
Figure 2B:
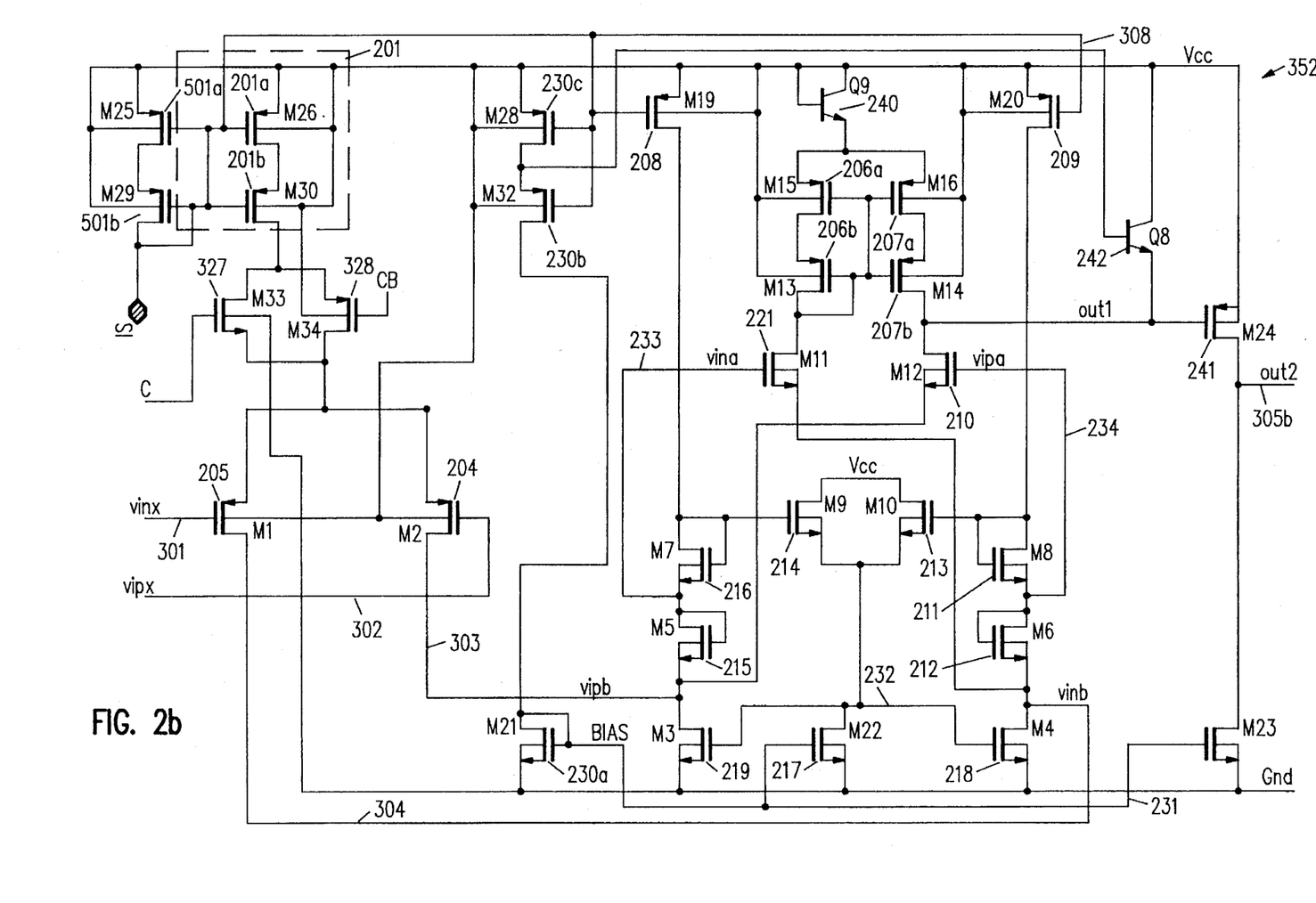
FIG. 2b is a transistor level schematic circuit showing in further detail the schematic diagram of AB cascode amplifier 352.

The present invention provides an "AB cascode" amplifier which has lower quiescent currents than a comparable folded cascode amplifier in the prior art. FIG. 2a is a schematic circuit of AB cascode amplifier 352, in accordance with the present invention. FIG. 2b is a transistor level schematic diagram showing AB cascode amplifier 352 in further detail.

To facilitate the present detailed description, corresponding elements in FIGS. 2a and 2b are provided the same reference numerals. FIGS. 2a and 2b each also show differential input transistors 204 and 205 receiving an input differential signal across terminals 301 and 302. Differential input transistors 204 and 205 form part of the input protection circuit 351 of FIGS. 3b and 3c. According to the relative voltages on the gate terminals 301 and 302 of input transistors 204 and 205, the current in current source 201 is split between transistors 204 and 205. As shown in FIG. 2b, current source 201 can be implemented by transistors 201a, 201b, 201c. Transistors 201a, 201b and 201c are biased by a bias voltage at terminal 308, which is generated by transistors 501a, 501b and 501c (transistor 501c is shown in FIG. 5b). Transistors 501a, 501b and 501 are part of bias circuit 354 described in detail in copending patent application, Ser. No. 08/295,331, incorporated by reference above.

Current source 201 is designed to provide a current ("I") of approximately 1.44 microamps in this embodiment. Shown in FIG. 2b also are transistors 327 and 328 which form a switch to turn off the currents in transistors 201a and 201b under the input protection scheme described in copending application, Ser. No. 08/295,135, which is incorporated by reference above.

The currents in transistors 204 and 205 are sunk by transistors 219 and 218 respectively. Transistors 218 and 219 also sink currents from (i) current sources 208 and 209 respectively, and (ii) the source terminals of NMOS transistors 210 and 211 respectively. Transistors 218 and 219 are biased by a current source formed by transistors 213, 214 and a current source 217. As shown in FIG. 2b, current source 217 can be implemented by an NMOS transistor biased by a bias voltage at terminal 231. Current source 217 is designed to sink approximately 300 nanoamps in this embodiment. The bias voltage at terminal 231 is generated by a current source formed by NMOS transistor 230a and PMOS transistors 230b and 230c. PMOS transistors 230b and 230c are biased by the bias voltage at terminal 308.

Current sources 208 and 209 are PMOS transistors biased by the bias voltage at terminal 308 (FIG. 2b) and are designed to provide a current ("$I_1$") of approximately 168 nanoamps in this embodiment. The currents in current source 208 is sunkin transistors 219 through a level shifter formed by transistors 216 and 215. Likewise, the current in current source 209 is sunk through a level shifter formed by transistors 211 and 212. The voltages at the drain terminals of transistors 215 and 212 are provided to the gate terminals 233 and 234 of transistors 221 and 210 respectively. The currents in transistors 221 and 210 are mirrored by PMOS transistors 206 and 207 respectively. As shown in FIG. 2b, transistor 206 can be implemented by serially connected transistors 206a and 206b. Likewise, transistor 207 can be implemented by serially connected transistors 207a and 207b. A NPN bipolar transistor 240 (FIG. 2b) is provided limit the maximum voltage swing at terminal 305a for faster transient response. Transistors 206 and 207 are designed to each provide, at equilibrium condition, a current ("$I_2$") of approximately 168 nanoamps in this embodiment.

The output signal of AB cascode amplifier 352 is taken from the drain terminal (labelled by reference numerals 305 and 305a in FIGS. 2a and 2b respectively) of transistor 210. This output signal can be amplified, for example, by transistor 241 (FIG. 2b) to be provided at terminal 305b.

During operation, if a negative differential voltage is imposed across 301 and 302, the current in transistor 204 decreases and the current in transistor 205 increases. Consequently, the voltage at terminal 303 increases and the voltage at terminal 304 decreases, to provide a differential voltage across terminals 304 and 305 corresponding to the differential voltage across terminals 301 and 302. The increase in voltage at terminal 303 increases the voltage at gate terminal 233 of transistor 221. Correspondingly, the decrease in voltage at terminal 304 decreases the voltage at gate terminal 234 of transistor 210. As a result, a rapid increase in gate-to-source voltage appears at transistor 221 and a corresponding rapid decrease in gate-to-source voltage appears at transistor 210. Consequently, the current in transistor 221 increases rapidly with a corresponding rapid decrease in current in transistor 210. With the current mirror of transistors 206a and 207a, the current in both transistor 207a and 207b increases, so that a net current flows from node 305a. With a high impedance at node 305a, the voltage at terminal 305 increases rapidly towards the supply voltage.

Conversely, if a positive differential voltage is impressed at terminals 301 and 302, the resulting gate-to-source voltage at transistor 221 decreases and the gate-to-source-voltage at transistor 210, leading to the voltage at terminal 305 to decreases rapidly towards ground voltage.

In AB cascode input stage 352, the transconductances of transistors 204 and 205 are not degraded, even if a large differential voltage exists between terminals 301 and 302, such that the currents flowing through transistors 206 and 207 and current sources 208 and 209 can be made small relatively to the current I in current source 201, the effective current at node 305 remains high. The total quiescent current in AB cascode input stage 352 is thus equal to $I+2*I_1+2*I_2$, which can be made significantly smaller than the total quiescent current of the prior art circuit shown in FIG. 6.

The above detailed description is provided to illustrate the specific embodiments of the present invention, and is not intended to be limiting. Numerous modifications and variations with the scope of the invention are possible. The present invention is defined by the following claims.

We claim:

1. An AB Cascode input circuit, comprising:
    a first current source having first and second terminals, said first terminal of said first current source being coupled to a first supply voltage source;
    a second current source having first and second terminals, said first terminal of said second current source being coupled to said first supply voltage source;
    a third current source having first and second terminals, said first terminal of said third current source being coupled to said first supply voltage source;
    a fourth current source having first and second terminals, said first terminals of said fourth current source being coupled to a second supply voltage source;
    a fifth current source having first and second terminals, said first terminals of said fifth current source being coupled to said second supply voltage source;
    a first transistor having a source terminal coupled to said first current source, a gate terminal coupled to receive a first input signal and a drain terminal coupled to said second terminal of said fourth current source;
    a second transistor having a source terminal coupled to said first current source, a gate terminal coupled to receive a second input signal and a drain terminal coupled to said second terminal of said fifth current source;
    a first level converter having first and second terminals, said first terminal of said first level converter coupled to said second terminal of said fourth current source, said second terminal of said first level converter coupled to said second terminal of said second current source;
    a second level converter having first and second terminals, said first terminal of said second level converter coupled to said second terminal of said fifth current source, said second terminal of said second level converter coupled to said second terminal of said third current source;
    a third transistor having a source terminal coupled to said first supply voltage source and a gate and a drain terminal coupled together;
    a fourth transistor having a source terminal coupled to said first supply voltage source and a gate coupled to said gate terminal of said third transistor and a drain terminal;
    a fifth transistor having a source terminal coupled to said second terminal of said fifth current source, a gate terminal coupled to said first terminal of said first level converter, and a drain terminal coupled to said drain terminal of said third transistor; and
    a sixth transistor having a source terminal coupled to said second terminal of said fourth current source, a gate terminal coupled to said first terminal of said second level converter, and a drain terminal coupled to said drain terminal of said fourth transistor.

2. An AB cascode input circuit as in claim 1, further comprising an sixth current source for generating a bias voltage for said fourth and fifth current source.

3. An AB cascode input circuit as in claim 1, wherein said first and second level converters each comprise a diode connected transistor.

* * * * *